(12) United States Patent
Yatsuo

(10) Patent No.: US 11,914,017 B2
(45) Date of Patent: Feb. 27, 2024

(54) MAGNETIC RESONANCE IMAGING APPARATUS AND IMAGE PROCESSING METHOD

(71) Applicant: FUJIFILM Healthcare Corporation, Kashiwa (JP)

(72) Inventor: Takeshi Yatsuo, Chiba (JP)

(73) Assignee: FUJIFILM Healthcare Corporation, Chiba (JP)

( * ) Notice: Subject to any disclaimer, the term of this patent is extended or adjusted under 35 U.S.C. 154(b) by 0 days.

(21) Appl. No.: 17/902,088

(22) Filed: Sep. 2, 2022

(65) Prior Publication Data

US 2023/0103170 A1   Mar. 30, 2023

(30) Foreign Application Priority Data

Sep. 24, 2021 (JP) ................ 2021-155073

(51) Int. Cl.
   *G01R 33/561* (2006.01)
   *G01R 33/565* (2006.01)

(52) U.S. Cl.
   CPC ..... *G01R 33/561* (2013.01); *G01R 33/56563* (2013.01)

(58) Field of Classification Search
   CPC ............ G01R 33/561; G01R 33/56563; G01R 33/482; G01R 33/56
   USPC ...................................................... 324/318
   See application file for complete search history.

(56) References Cited

U.S. PATENT DOCUMENTS

| 4,706,023 | A  | * | 11/1987 | Den Boef | ............ | G01R 33/565 |
| | | | | | | 324/309 |
| 2008/0095358 | A1 | * | 4/2008 | Eguchi | ................... | G06T 5/003 |
| | | | | | | 708/403 |
| 2015/0268322 | A1 | * | 9/2015 | Paul | ....................... | G01R 33/34 |
| | | | | | | 324/309 |
| 2017/0234957 | A1 | * | 8/2017 | Zho | ..................... | G01R 33/443 |
| | | | | | | 324/309 |
| 2018/0156884 | A1 | * | 6/2018 | Heidemann | ........ | G01R 33/4818 |

FOREIGN PATENT DOCUMENTS

JP          2005-95329 A      4/2005
WO      WO 2006/041126 A1   4/2006

\* cited by examiner

*Primary Examiner* — Christopher P McAndrew
(74) *Attorney, Agent, or Firm* — Paul Teng

(57) ABSTRACT

Super-resolution processing is performed on an MRI image by using an NMR signal as a point spread function (PSF). Image processing of increasing a resolution is performed on a reconstructed image by using the point spread function. The point spread function is a signal obtained by, after a phantom disposed in an imaging space is irradiated with a high-frequency magnetic field, acquiring a nuclear magnetic resonance signal from the phantom without applying frequency encoding and phase encoding, and performing Fourier transform on the acquired nuclear magnetic resonance signal.

9 Claims, 7 Drawing Sheets

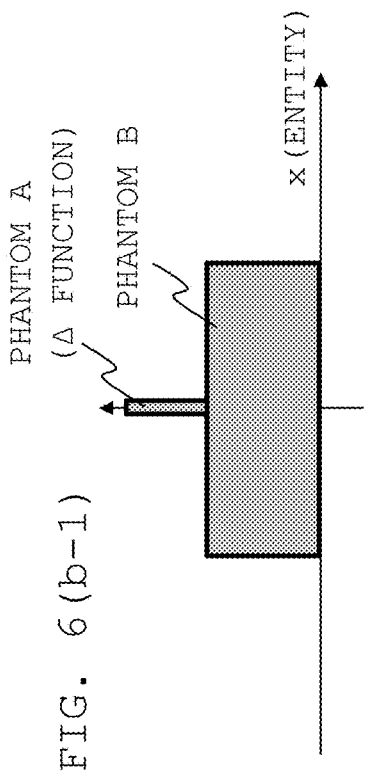
FIG. 6(a-1)
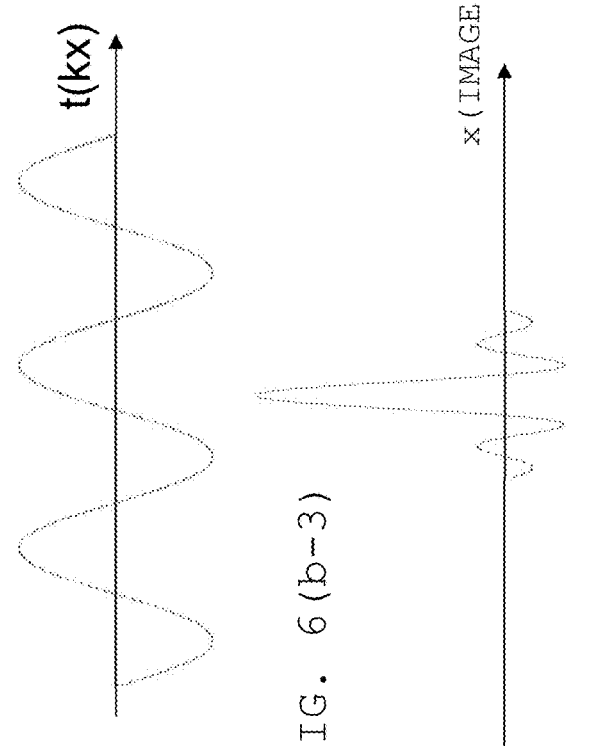
FIG. 6(a-2)
FIG. 6(a-3)
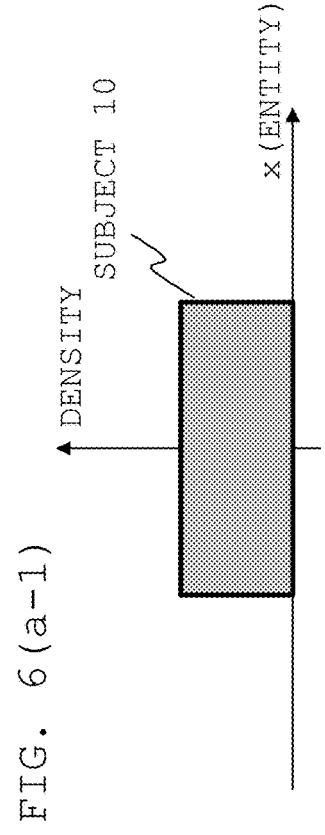
FIG. 6(b-1)
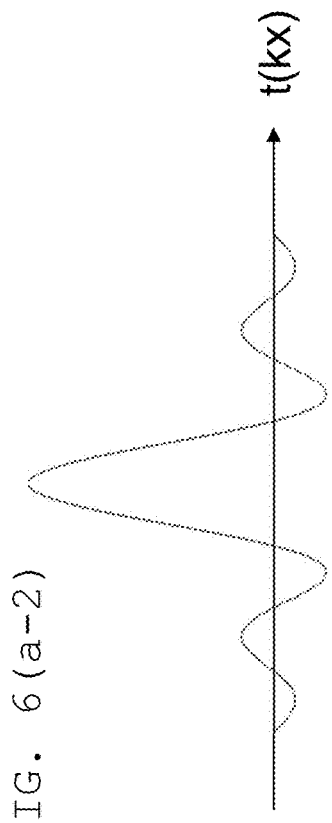
FIG. 6(b-2)
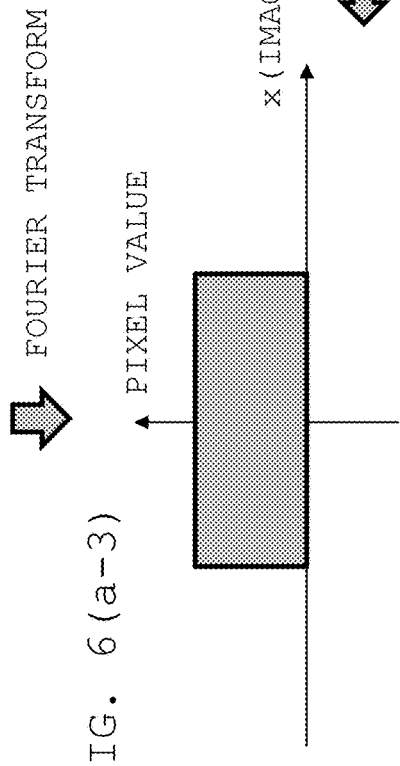
FIG. 6(b-3)

MAGNETIC RESONANCE IMAGING APPARATUS AND IMAGE PROCESSING METHOD

BACKGROUND OF THE INVENTION

1. Field of the Invention

The present invention relates to a magnetic resonance imaging (hereinafter referred to as "MRI") apparatus that measures a nuclear magnetic resonance (hereinafter referred to as "NMR") signal from hydrogen, phosphorus, or the like in a subject, and that images a density distribution, a relaxation time distribution of a nucleus, and the like, the apparatus having a function of performing super-resolution processing.

2. Description of the Related Art

An MRI apparatus is a device that measures an NMR signal generated by atomic nuclear spins forming tissue of a subject, in particular, a human body, and two-dimensionally or three-dimensionally images morphology and functions of a head, an abdomen, a limb, and the like. In imaging, the NMR signal is frequency-encoded with different phase encodings being applied depending on a gradient magnetic field, and is measured as time series data. The measured NMR signal is reconstructed into an image by two-dimensional or three-dimensional Fourier transform.

Since an image obtained by the MRI apparatus is used to determine a presence or absence of a disease and a state of the disease, high definition and high SN are always required. In order to meet this requirement, many techniques have been developed for the MRI apparatus.

On the other hand, WO 2006/041126 discloses a method of bringing an image deteriorated by transmission close to an original image using a function indicating transmission characteristics. For example, assuming that an image of a point of light is formed in the original image, a probability density distribution in which the image of the light is formed in the deteriorated image is represented by a point spread function (PSF). It is disclosed that the original image can be calculated (estimated) by a Richardson-Lucy algorithm from the deteriorated image and the PSF obtained in advance. Further, the invention of WO 2006/041126 also discloses that an optical system lens is assumed as a transmission system, and an optical transfer function (OTF) is used instead of the PSF.

JP-A-2005-95329 discloses that in order to achieve a high resolution exceeding a resolution limit, which depends on a pitch of detection elements, in a CT image captured by an X-ray computed tomography (CT) apparatus, processing (super-resolution processing) is performed using a point spread function (PSF). Specifically, deconvolution (deconvolution calculation) of the CT image with the PSF obtained in advance gives a resolution exceeding the resolution limit caused by the pitch of the detection elements and the like. As the PSF, a distribution (blur) of image data obtained by capturing a phantom of a wire or a sphere smaller than the pitch of the detection elements of an X-ray CT apparatus by the X-ray CT apparatus is used.

SUMMARY OF THE INVENTION

In JP-A-2005-95329, in the case of the X-ray CT apparatus, the phantom of the wire or the sphere smaller than the pitch of the detection elements is captured by the X-ray CT apparatus to obtain the image data, and the image data is used as the PSF.

However, JP-A-2005-95329 discloses that the super-resolution processing using the PSF is similarly possible in the MRI apparatus, but does not disclose any specific PSF calculation method in the MRI apparatus.

When a technique disclosed in JP-A-2005-95329 is applied to the MRI apparatus, a minute phantom is disposed in a static magnetic field space and is irradiated with high-frequency magnetic field pulse to generate nuclear magnetic resonance in the atomic nuclear spins of the minute phantom, and the gradient magnetic field is applied to an x-axis direction and a y-axis direction, thereby receiving the NMR signal obtained by applying frequency encoding in an x-axis direction and applying the phase encoding in a y-axis direction. This operation is repeated 256 times or 512 times while changing a phase encoding amount little by little, and 256 or 512 NMR signals obtained are disposed in a k-space (measurement space) and subjected to the two-dimensional Fourier transform to reconstruct a two-dimensional image of the minute phantom. The obtained image is used as the PSF. In this method, it is necessary to capture a two-dimensional MRI image over time with respect to the minute phantom.

An object of the invention is to perform super-resolution processing on an MRI image using an NMR signal as a point spread function (PSF).

In order to solve the above problems, according to the invention, a magnetic resonance imaging apparatus includes a static magnetic field generator configured to apply a static magnetic field to an imaging space; a high-frequency magnetic field irradiation device configured to irradiate atomic nuclear spins of a subject disposed in the imaging space with a high-frequency magnetic field; a gradient magnetic field generator configured to apply a gradient magnetic field in two predetermined directions in order to apply frequency encoding and phase encoding to the atomic nuclear spins; a reception device configured to receive a nuclear magnetic resonance signal generated by the atomic nuclear spins; an image reconstruction unit configured to reconstruct an image of the subject by performing two-dimensional Fourier transform on a plurality of the nuclear magnetic resonance signals disposed in a measurement space; and an image processing unit configured to perform processing of increasing a resolution on the reconstructed image by using a point spread function.

The point spread function is a signal obtained by, after a phantom disposed in the imaging space is irradiated with the high-frequency magnetic field from the high-frequency magnetic field irradiation device, causing the reception device to acquire the nuclear magnetic resonance signal from the phantom without applying the frequency encoding and the phase encoding, and performing Fourier transform on the acquired nuclear magnetic resonance signals.

According to the invention, it is possible to generate a stable and high-resolution MRI image by using the NMR signal as the PSF.

BRIEF DESCRIPTION OF THE DRAWINGS

FIG. 6(a-1) to FIG. (b-3) are a flowchart showing the operation of the MRI apparatus according to the first embodiment.

DESCRIPTION OF THE PREFERRED EMBODIMENTS

An embodiment of the invention will be described with reference to the drawings.

In the present embodiment, processing of increasing a resolution is performed on an image reconstructed by an MRI apparatus by using a point spread function. As the point spread function (PSF), a signal obtained by, after a phantom disposed in an imaging space is irradiated with a high-frequency magnetic field, acquiring a nuclear magnetic resonance signal from the phantom without applying frequency encoding and phase encoding, and performing Fourier transform on the acquired nuclear magnetic resonance signal is used.

Accordingly, in the MRI apparatus, the PSF is directly acquired from the NMR signal, and super-resolution processing can be performed.

Since position encoding (the frequency encoding and the phase encoding) is not performed when the NMR signal is acquired, if the MRI apparatus is an ideal device that has no reflection, or the like in a signal transmission system of the NMR signal of the MRI apparatus, the obtained NMR signal is a signal corresponding to an optically ideal point image. Therefore, in an actual MRI apparatus, a distortion included in the NMR signal not subjected to the position encoding (frequency encoding and phase encoding) is caused by, for example, the reflection of the signal transmission system of the NMR signal. Therefore, by using the NMR signal not subjected to the position encoding as the PSF, it is possible to acquire the PSF with higher accuracy than using a phantom image reconstructed by two-dimensional Fourier transform.

By performing the super-resolution processing on the MRI image using the PSF, a high-resolution MRI image with high accuracy can be obtained.

In addition, since it is not necessary to reconstruct a two-dimensional image of the phantom by the two-dimensional Fourier transform when the PSF is acquired, it is possible to acquire the PSF in a short time.

Hereinafter, the MRI apparatus of the present embodiment will be specifically described.

First Embodiment

Configuration of MRI Apparatus

Figure 1:
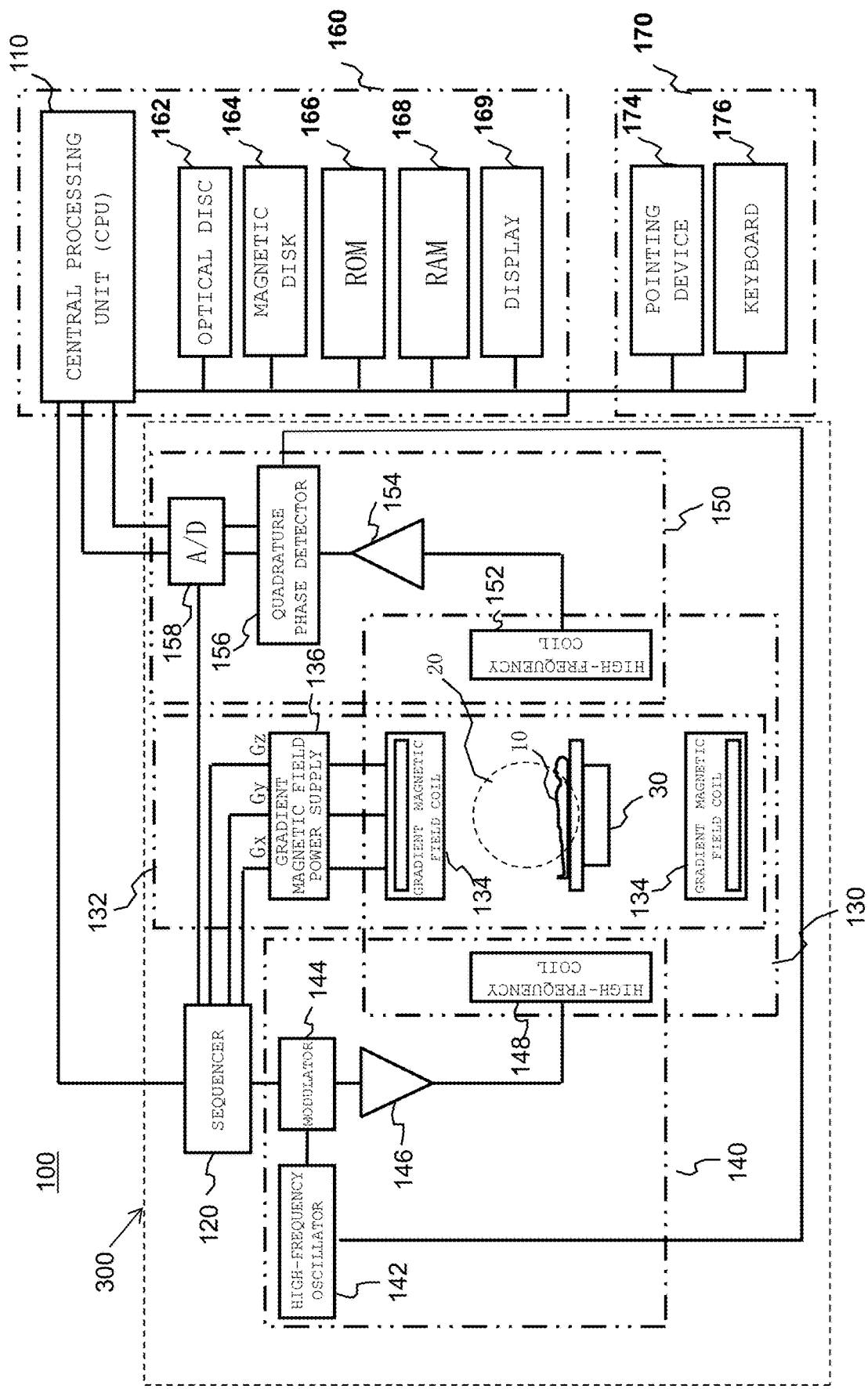
FIG. 1 is a block diagram showing an overall configuration of an MRI apparatus according to a first embodiment of the invention.

First, a configuration of an MRI apparatus 100 according to a first embodiment will be described with reference to FIG. 1.

The MRI apparatus 100 includes a static magnetic field generator 130, a gradient magnetic field generator 132 that applies a gradient magnetic field pulse to a subject 10, a high-frequency magnetic field irradiation device 140 that irradiates the subject 10 with a high-frequency magnetic field pulse (hereinafter, referred to as an RF pulse), a reception device 150 that receives an echo signal as the NMR signal from the subject 10, a processing device 160 that includes a central processing unit (hereinafter, referred to as a CPU) 110, a sequencer 120, an operation device 170 for performing various operations related to input of data, imaging, and the like, and a bed 30.

The static magnetic field generator 130 applies a uniform magnetic field to an imaging space 20.

The subject 10 is mounted on the bed, and at least a part to be imaged of the subject 10 is disposed in the imaging space 20.

The gradient magnetic field generator 132, the high-frequency magnetic field irradiation device 140, and the reception device 150 form an imaging unit 300. The imaging unit 300 applies the RF pulse and the gradient magnetic field pulse to the subject 10 disposed in the imaging space 20, and acquires the NMR signal generated from the subject.

Figure 2:
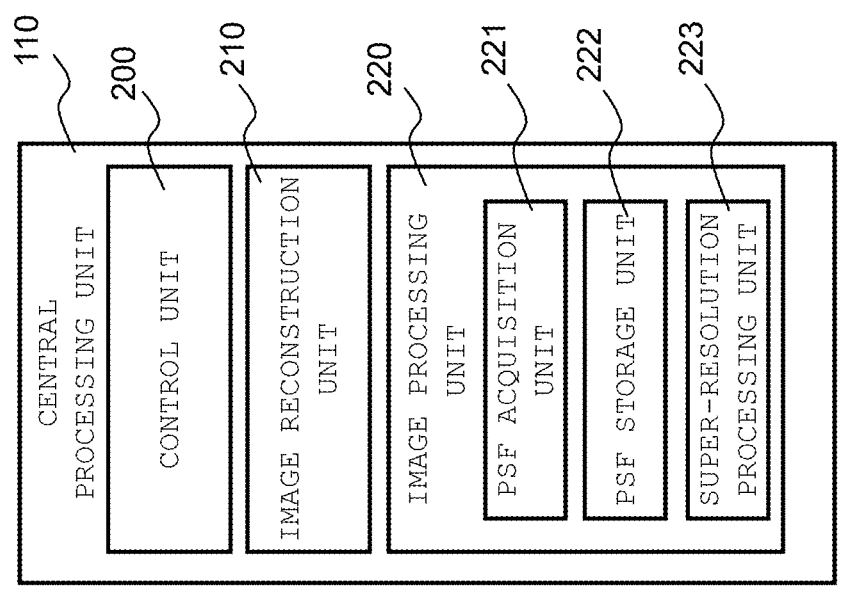
FIG. 2 is a functional block diagram of a central processing unit 110 of the MRI apparatus according to the first embodiment.

As shown in a functional block diagram of FIG. 2, the central processing unit 110 functions as a control unit 200, and controls the sequencer 120 such that the imaging unit 300 repeatedly applies the high-frequency magnetic field pulse and the gradient magnetic field pulse and acquires the nuclear magnetic resonance signal at a predetermined timing according to a predetermined imaging pulse sequence.

The central processing unit 110 also functions as an image reconstruction unit 210, and processes the number of NMR signals necessary for reconstruction of the image acquired by the imaging unit 300 to generate a tomographic image (MRI image) of the subject 10.

Further, the central processing unit 110 also functions as an image processing unit 220, and performs the processing of increasing the resolution on the reconstructed MRI image of the subject 10 by using the point spread function. Therefore, the image processing unit 220 includes a PSF acquisition unit 221 that acquires the point spread function, a PSF storage unit 222 that stores the acquired point spread function, and a super-resolution processing unit 223 that processes the MRI image using the PSF. The PSF storage unit 222 may be a memory built in the central processing unit 110, or may be implemented by a RAM 168, an optical disc 162, or the like.

Further, details of each unit will be described. Although a description of a specific configuration of the static magnetic field generator 130 is omitted, the static magnetic field generator 130 generates a fairly uniform static magnetic field in a space around the subject 10 in a direction orthogonal to a body axis of the subject 10 in a case of a vertical magnetic field method, and generates the fairly uniform static magnetic field in the space around the subject 10 in the body axial direction in a case of a horizontal magnetic field method. The static magnetic field generator 130 is disposed around the subject 10 and includes a permanent magnet, a normal conducting magnet, or a superconducting magnet as a static magnetic field generating source in order to generate the static magnetic field.

The high-frequency magnetic field irradiation device 140 irradiates the subject 10 with the RF pulse to excite the atomic nuclear spins of atoms forming a biological tissue of the subject 10 and cause nuclear magnetic resonance. For example, the high-frequency magnetic field irradiation device 140 includes a high-frequency oscillator 142, a modulator 144, a high-frequency amplifier 146, and a high-frequency coil 148 on a transmission side operating as a transmission coil. A high-frequency pulse output from the high-frequency oscillator 142 is amplitude-modulated by the modulator 144 at an instructed timing from the sequencer 120, and the amplitude-modulated high-frequency pulse is amplified by the high-frequency amplifier 146. The amplified high-frequency pulse is supplied to the high-frequency coil 148 disposed close to the subject 10. Accordingly, the high-frequency coil 148 irradiates the subject 10 with the RF pulse.

The gradient magnetic field generator 132 includes gradient magnetic field coils 134 wound in three axial directions of an X axis, a Y axis, and a Z axis, which are coordinate systems of the MRI apparatus 100, for example, a static coordinate system, and a gradient magnetic field power supply 136 that supplies a drive current for generating the gradient magnetic field to each of the gradient magnetic field coils. The gradient magnetic field power supply 136 operates in accordance with an instruction from the sequencer 120, and supplies the drive current to the gradient magnetic field coils 134 in the three axial directions of the X axis, the Y axis, and the Z axis. Accordingly, the gradient magnetic field coils 134 generate gradient magnetic fields Gx, Gy, and Gz in the three axial directions of the X axis, the Y axis, and the Z axis. The generated gradient magnetic fields Gx, Gy, and Gz are applied to the subject 10 in the imaging space 20. At the time of imaging, the gradient magnetic field pulse (Gz) for determining a slice plane in a direction orthogonal to an imaging cross-section (slice plane) is applied in accordance with the imaging pulse sequence. The gradient magnetic field pulse (Gx) for applying the frequency encoding to the atomic nuclear spins and the gradient magnetic field pulse (Gy) for applying the phase encoding are applied to the remaining two X and Y directions orthogonal to the slice plane and orthogonal to each other. Accordingly, position information in each direction is encoded into the echo signal (NMR signal) emitted from the atomic nuclear spins.

The reception device 150 receives and processes the emitted NMR signal. The reception device 150 includes a high-frequency coil 152 on a reception side that operates as a receiving coil, a signal amplifier 154 that amplifies the received NMR signal, a quadrature phase detector 156, and an A/D converter 158 that converts an analog signal into a digital signal. The high-frequency coil 152 detects the NMR signal emitted from the subject, and the signal amplifier 154 amplifies the detected NMR signal. The quadrature phase detector 156 divides the NMR signal into two orthogonal systems of signals at the instructed timing from the sequencer 120. The divided two systems of signals are converted into digital amounts by the A/D converter 158, respectively, and transmitted to the central processing unit 110.

The high-frequency coil 148 on the transmission side and the gradient magnetic field coils 134 are disposed in a static magnetic field space of the static magnetic field generator 130 in which the subject 10 is disposed. The high-frequency coil 148 on the transmission side and the gradient magnetic field coils 134 are disposed to face the subject 10 in the case of the vertical magnetic field method, and are disposed to surround the subject 10 in the case of the horizontal magnetic field method. The high-frequency coil 152 on the reception side is disposed to face or surround the subject 10.

Under the control of the central processing unit 110, the sequencer 120 outputs a control signal (command) to the high-frequency magnetic field irradiation device 140, the gradient magnetic field generator 132, and the reception device 150 at the predetermined timing. Accordingly, the RF pulse and the gradient magnetic field pulse are applied to the subject at the timing according to the predetermined imaging pulse sequence, and the acquisition of the NMR signal is repeatedly executed by the imaging unit 300 while changing the phase encoding amount.

In addition to the central processing unit 110, the processing device 160 includes an external storage device such as an optical disc 162 and a magnetic disk 164 for storing information, a ROM 166 for storing necessary data and programs for processing, a RAM 168 for performing temporary storage for processing, and a display 169 such as a CRT. Accordingly, the processing device 160 performs various types of data processing, display and storage of processing results, and the like. For example, when the processing results received and processed by the reception device 150 are input from the reception device 150 to the processing device 160, the central processing unit 110 of the processing device 160 performs processing such as signal processing, image reconstruction, and image processing. The tomographic image of the subject 10, which is a result thereof, is displayed on the display 169, and is also recorded on the optical disc 162, the magnetic disk 164, or the like of the external storage device as necessary. Although not shown in the drawings, it is also possible to print or transmit the results to other systems.

The operation device 170 includes a pointing device 174 such as a trackball or a mouse, and a keyboard 176. An operator inputs various pieces of control information on the MRI apparatus 100 and control information on processing performed by the processing device 160 via the operation device 170. The operation device 170 is disposed close to the display 169, and the operator can interactively perform an operation through the operation device 170 while viewing contents of the display 169. The operation device 170 is not limited to this, and may include, for example, a touch panel provided on a display surface of the display 169. The operation device 170 is provided in an operation room separated from a main body of the MRI apparatus 100. A part of the operation device 170 is also further provided on the main body of the MRI apparatus 100 and the bed 30. Accordingly, the operation device 170 is configured such that the operator can perform necessary operations near the subject 10.

A nuclide to be imaged of the subject 10 of the MRI apparatus 100 is, for example, a hydrogen nucleus, that is, a proton, which is a main constituent substance of the subject, which is widely used clinically. The MRI apparatus 100 images information on a spatial distribution of a proton density and a spatial distribution of relaxation time of an excited state. Accordingly, the MRI apparatus 100 can two-dimensionally or three-dimensionally capture an image of a form or a function of, for example, a head, an abdomen, or a limb of the subject 10, and can display the reconstructed image on the display 169. The reconstructed image is stored in the optical disc 162 or the magnetic disk 164 as necessary. The image is printed based on the operation, or is transmitted to other necessary systems.

Imaging Operation of MRI Apparatus

The imaging pulse sequence is stored in advance for each of a plurality of imaging methods in the memory built in the central processing unit 110, the magnetic disk 164, the ROM 166, or the like. The operator selects the imaging method via the operation device 170, and further inputs imaging conditions (repetition time TR and the like). Accordingly, the central processing unit 110 generates the imaging pulse sequence corresponding to the set imaging conditions.

Figure 3:
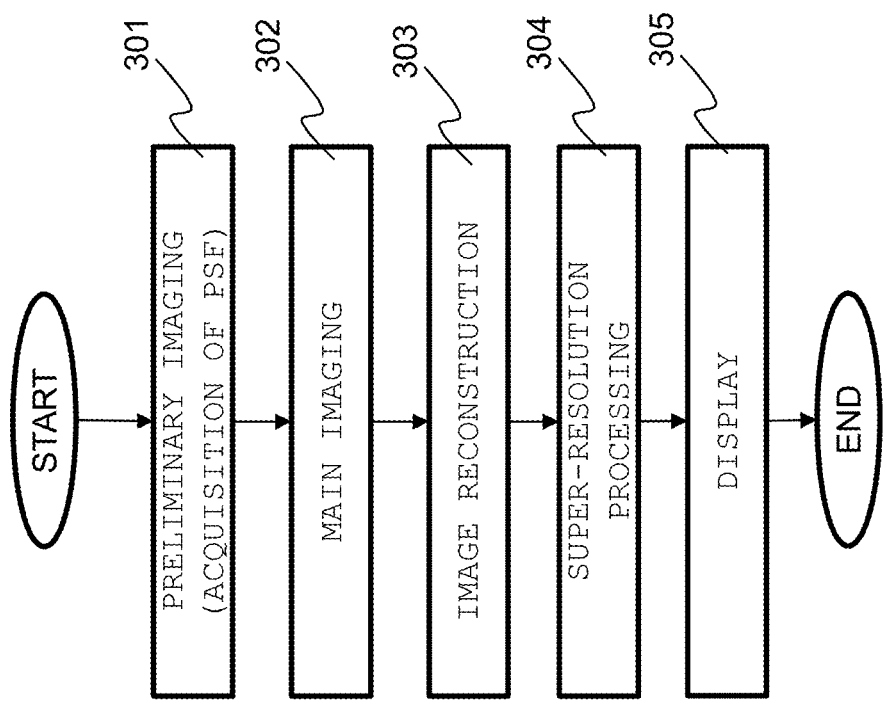
FIG. 3 is a flowchart showing an operation of the MRI apparatus according to the first embodiment.
Figure 4:
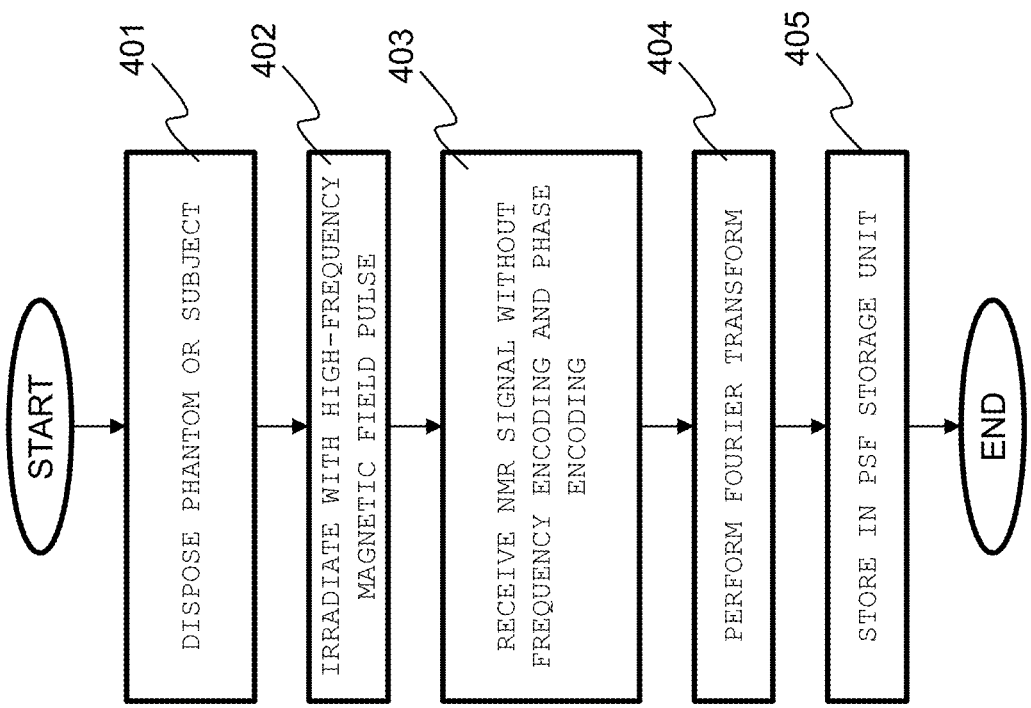
FIG. 4 is a flowchart showing the operation of the MRI apparatus according to the first embodiment.
Figure 5:
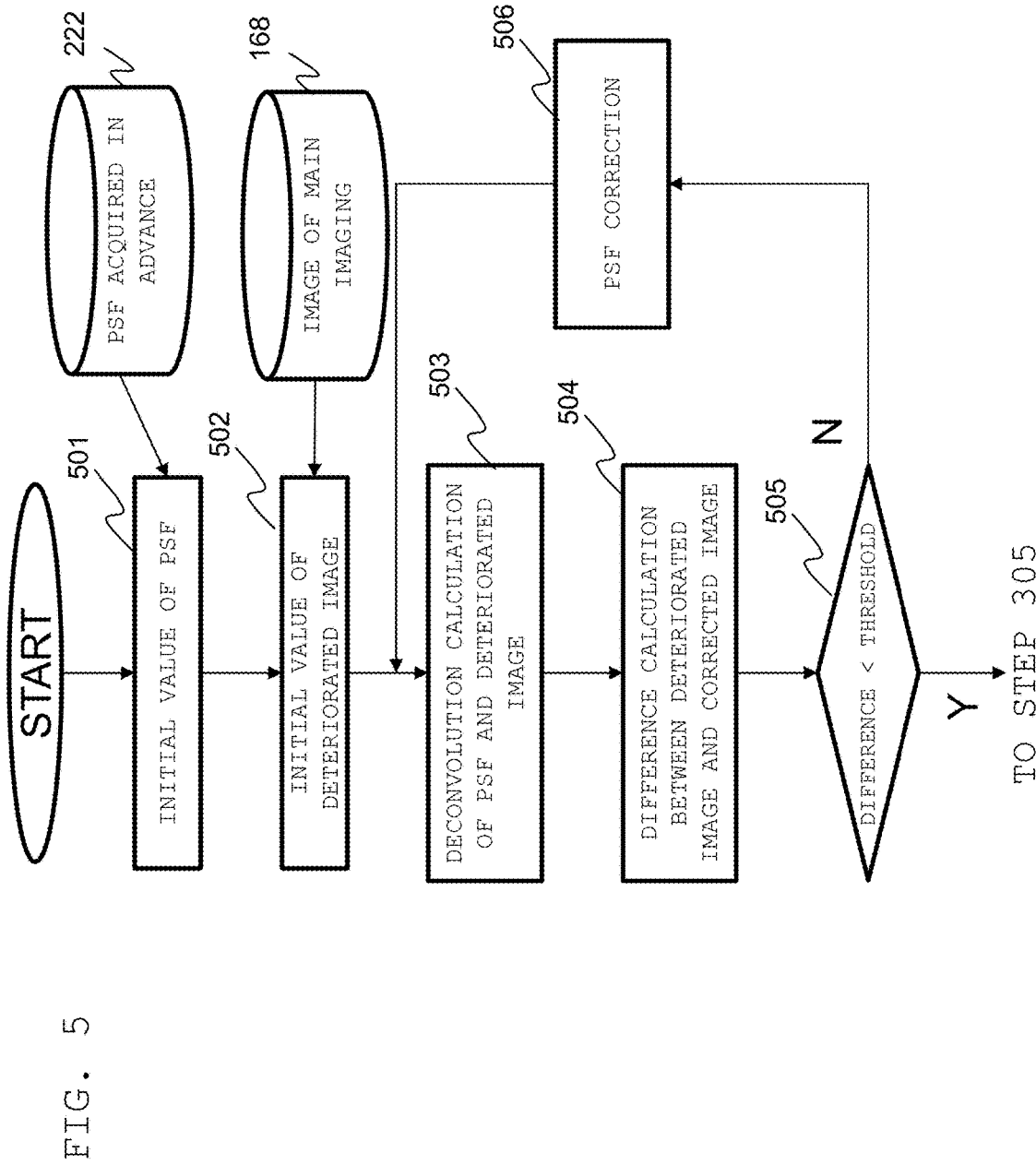
FIG. 5 is a flowchart showing the operation of the MRI apparatus according to the first embodiment.

Here, the central processing unit 110 is a processor (computer) such as a central processing unit (CPU) or a graphics processing unit (GPU), reads and executes a program stored in the ROM 166 in advance, and implements functions of the units in FIG. 2 by software. Accordingly, the processing shown in flows of FIGS. 3 to 5 is executed. Some or all of the functions of FIG. 2 can also be implemented by hardware. For example, a part or the whole of the central processing unit 110 may be implemented using a custom IC such as an application specific integrated circuit (ASIC) or a programmable IC such as a field-programmable gate array (FPGA), and the programmable IC may be circuit-designed to perform the processing of FIGS. 3 and 4.

An imaging operation of the MRI apparatus of the present embodiment will be described in detail with reference to the flows of FIGS. 3 and 4.

Step 301

First, the PSF acquisition unit 221 of the image processing unit 220 acquires the PSF by executing preliminary imaging, and stores the acquired PSF in the PSF storage unit 222. Hereinafter, step 301 will be described in detail with steps 401 to 405.

Step 401

Specifically, the operator first disposes the subject 10 in the imaging space 20.

Step 402

The PSF acquisition unit 221 controls the sequencer 120 to irradiate the phantom with the high-frequency magnetic field pulse from the high-frequency magnetic field irradiation device 140 and excite nuclear magnetic spins of the phantom.

Step 403

The PSF acquisition unit 221 causes the reception device 150 to receive the NMR signal emitted from the nuclear magnetic spins of the subject at the predetermined timing without applying the gradient magnetic field for the frequency encoding and the gradient magnetic field for the phase encoding.

Since the frequency encoding is not performed, in a case of an ideal device that has no reflection, or the like in the signal transmission system of the NMR signal of the MRI apparatus, the NMR signal has no spread in a frequency direction. Therefore, the NMR signal becomes a single frequency signal or a DC component as shown in FIG. 6(b-2). Accordingly, regardless of a size of the subject 10, even when the subject 10 is a minute (close to A function) object such as a phantom A in FIG. 6(b-1) or a non-minute object such as a phantom B, the obtained NMR signal can be the single frequency signal or the DC component as long as the MRI apparatus is the ideal device.

In fact, since the MRI apparatus has a reflection, a wraparound, a phase shift, and the like of the transmission system of the NMR signal, the NMR signal of FIG. 6(b-2) has a distortion component and does not become a complete single frequency or DC component.

Step 404

The PSF acquisition unit 221 performs the Fourier transform on the NMR signal of FIG. 6(b-2) obtained without performing the frequency encoding and the phase encoding.

Since the NMR signal of FIG. 6(b-2) has the distortion, the NMR signal after the Fourier transform does not have a complete single peak (A function) but a waveform with spread as shown in FIG. 6(b-3). This spread represents the reflection, the wraparound, the phase shift, and the like of the signal transmission system of the NMR signal of the MRI apparatus.

Step 405

The PSF acquisition unit 221 stores the NMR signal of FIG. 6(b-3) in the PSF storage unit 222 as the PSF.

Accordingly, it is possible to acquire the PSF with high accuracy for the MRI apparatus. A point that the PSF in the MRI apparatus is different from the PSF in another optical system is that the PSF is not one-dimensional data of only an intensity signal, but is complex data of a real part and an imaginary part (or an intensity and a phase).

Step 302

Next, the control unit 200 generates an imaging sequence of imaging conditions received from the operator, sets the generated imaging sequence to the sequencer 120, and causes the imaging unit 300 to execute main imaging of the subject 10.

Specifically, as shown in FIG. 6(a-1), the control unit 200 irradiates the subject 10 disposed in the imaging space 20 with the high-frequency magnetic field pulse from the high-frequency magnetic field irradiation device 140 according to the imaging sequence to excite the nuclear magnetic spins, performs the phase encoding by applying the gradient magnetic field pulse Gy in the Y direction from the gradient magnetic field generator 132, and receives the NMR signal by the reception device 150 while applying the gradient magnetic field pulse Gx in the X direction.

Accordingly, when the subject 10 as shown in FIG. 6(a-1) is disposed, the NMR signal of a waveform such as a sinc function is received as shown in FIG. 6(a-2). The reception device 150 acquires the NMR signal of one line for one AD conversion. In fact, since the NMR signal of one line is QD-detected, complex data of the real part and the imaginary part is obtained.

The control unit 200 repeats the imaging sequence while changing the phase encoding amount, and the reception device 150 sequentially receives 256 or 512 NMR signals having different phase encoding amounts.

Step 302

Figure 7:
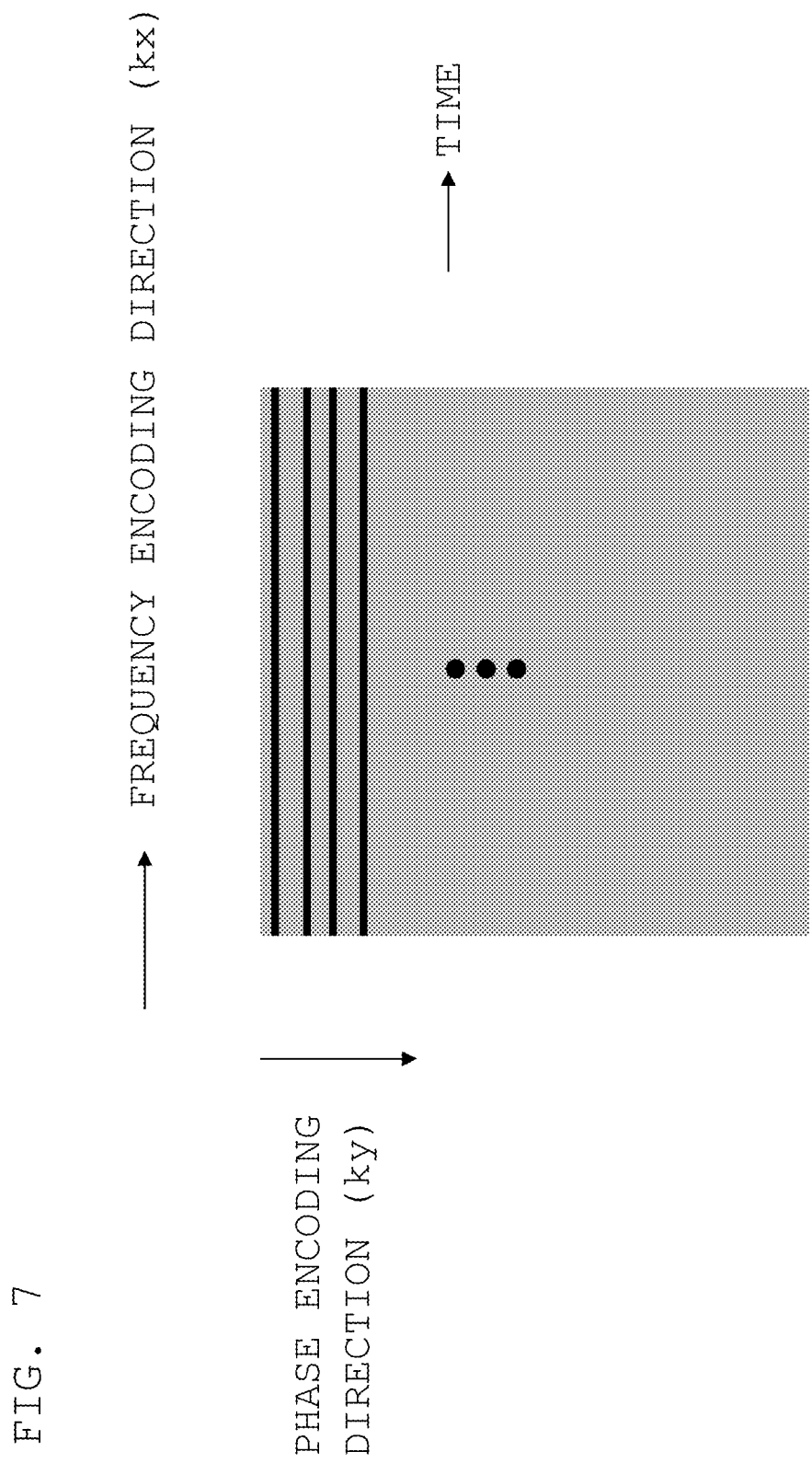
FIG. 7 is a diagram illustrating arrangement of acquired NMR signals in a k-space in the MRI apparatus according to the first embodiment.

As shown in FIG. 7, the image reconstruction unit 210 arranges the obtained NMR signals in a measurement space (k-space) in which a frequency encoding direction is kx and a phase encoding direction is ky. That is, the k-space is filled by stacking one-dimensional NMR data having different phase encodings in a two-dimensional space of the frequency encoding direction and the phase encoding direction.

The image reconstruction unit 210 reconstructs a two-dimensional MRI image (real space of x-y) by performing the two-dimensional Fourier transform on the NMR signal of the k-space. Accordingly, the MRI image close to an entity (subject 10) can be obtained as shown in FIG. 6(a-3).

The image reconstruction unit 210 stores the obtained MRI image of the main imaging in the RAM 168 or the like.

Step 304

The super-resolution processing unit 223 of the image processing unit 220 performs the super-resolution processing on the MRI image obtained in step 303.

Detailed processing of step 304 will be described along steps 501 to 506 of the flow of FIG. 5.

Step 501

The super-resolution processing unit 223 reads the PSF stored in step 405 in the PSF storage unit 222, and sets the PSF as an initial value of the PSF.

Step 502

The super-resolution processing unit 223 reads the MRI image of the main imaging (hereinafter, also referred to as a deteriorated image) stored in the RAM 168 or the like.

Step 503

The super-resolution processing unit 223 performs the deconvolution calculation (deconvolution) on the read PSF and MRI image of the main imaging. Accordingly, the resolution of the deteriorated image (MRI image) is increased.

Step 504

The super-resolution processing unit 223 obtains a difference between the deteriorated image (MRI image) and the image that is highly resolved in step 503 by calculation.

Step 505

When the difference obtained in step 504 is equal to or greater than a predetermined threshold, the super-resolution processing unit 223 proceeds to step 506.

Step 506

The super-resolution processing unit 223 corrects the PSF (initial value of the PSF in step 501 at the first time) based on the difference obtained in step 504, returns to step 503, and performs the deconvolution calculation of the PSF and the deteriorated image again.

Steps 503 to 506 are repeated until the difference between the deteriorated image (MRI image) and the image that is highly resolved in step 503 becomes smaller than the threshold. Accordingly, accuracy of the PSF is improved every time repetition is performed, and a higher-resolution image can be obtained.

Step 305

The super-resolution processing unit 223 displays the high-resolution image obtained by the repetition of steps 503 to 506 on the display 169.

As described above, according to the first embodiment, the PSF that well reflects characteristics of the MRI apparatus can be obtained in a short time by acquiring the nuclear magnetic resonance signal from the subject without applying the frequency encoding and the phase encoding, and using the signal obtained by performing the Fourier transform on the acquired nuclear magnetic resonance signal as the PSF.

Therefore, by performing the super-resolution processing on the MRI image using the PSF, a high-resolution MRI image with higher accuracy can be obtained.

Second Embodiment

In the first embodiment, the subject 10 that performs the main imaging is also used for acquiring the PSF in step 301, but considering the size of the subject 10, the PSF has a width in the frequency direction due to an influence of static magnetic field uniformity. Therefore, in a second embodiment, in order to avoid an influence of non-uniformity of a static magnetic field intensity, the PSF is acquired by executing step 301 (steps 401 to 405) of the first embodiment using a sufficiently small phantom, which will be described later. Since a device configuration of the MRI apparatus of the second embodiment and an operation of each unit are the same as those of the first embodiment except that the sufficiently small phantom is used, the description thereof will be omitted.

A PSF signal of the second embodiment will be further described. In the configuration of the present embodiment in which the NMR signal is acquired without applying the position encoding (frequency encoding and phase encoding) and used as the PSF, when a magnetic field intensity at a position where the object is placed is not completely the same, the frequency of the NMR signal obtained in FIG. 6(b-2) has a width depending on magnetic field non-uniformity. Since magnetic field uniformity is different depending on the position, it is not appropriate to apply the obtained PSF to the entire image.

Therefore, if an appropriate phantom that is sufficiently large enough to obtain a signal and is sufficiently small enough to ignore the magnetic field non-uniformity is disposed in the imaging space, the position encoding is omitted, and the NMR signal is acquired and defined as the PSF, it is possible to obtain an appropriate PSF that reflects the signal transmission system of the MRI apparatus without being affected by the magnetic field non-uniformity.

When the phantom becomes smaller, a signal intensity becomes smaller in proportion to a volume thereof, and on the other hand, a signal noise ratio becomes higher in proportion to the static magnetic field intensity. Therefore, although the sufficiently small phantom cannot be unconditionally formulated, for example, if a phantom of about 3 cm square is used in a 1.5T device, it is sufficient to acquire the NMR signal for the PSF. If the phantom is about 3 cm square, the influence of the magnetic field non-uniformity can be sufficiently avoided.

Third Embodiment

In the second embodiment, the influence of static magnetic field non-uniformity is eliminated by using a small phantom, but in a third embodiment, when the high-frequency magnetic field pulse is applied to the subject 10 or the phantom in step 402, the PSF is acquired while avoiding the influence of the static magnetic field non-uniformity in the same manner by selectively exciting only the atomic nuclear spins in a very narrow range.

Specifically, as a method of selectively exciting the atomic nuclear spins, there is a method implemented by hitting a presaturation pulse that prevents a signal from a non-selected part, and a method of exciting only a desired part by using a two-dimensional selective RF pulse.

In the first to third embodiments, the case where the NMR signal is the one-dimensional data has been described, but the invention can also be applied to a two-dimensional or three-dimensional MRI image.

An algorithm for the super-resolution processing of an image using the PSF is not limited to the above-described algorithm, and various known algorithms can be used. That is, a method of using the PSF is not particularly limited, and the high-resolution processing can be performed using a method with higher accuracy.

What is claimed is:

1. A magnetic resonance imaging apparatus, comprising:
a static magnetic field generator configured to apply a static magnetic field to an imaging space;
a high-frequency magnetic field irradiation device configured to irradiate atomic nuclear spins of a subject disposed in the imaging space with a high-frequency magnetic field;
a gradient magnetic field generator configured to apply a gradient magnetic field in two predetermined directions in order to apply frequency encoding and phase encoding to the atomic nuclear spins;
a reception device configured to receive a nuclear magnetic resonance signal generated by the atomic nuclear spins;
an image reconstruction unit configured to reconstruct an image of the subject by performing two-dimensional Fourier transform on a plurality of the nuclear magnetic resonance signals disposed in a measurement space; and
an image processing unit configured to perform processing of increasing a resolution on the reconstructed image by using a point spread function, wherein the image processing unit includes an acquisition unit configured to acquire the point spread function, and a storage unit configured to store the acquired point spread function, and the acquisition unit causes the high-frequency magnetic field irradiation device to irradiate a phantom or the subject disposed in the imaging space with the high-frequency magnetic field, the acquisition unit causes the reception device to acquire the nuclear magnetic resonance signal from the phantom or the subject without applying the frequency encoding and the phase encoding, the acquisition unit performs Fourier transform on the acquired nuclear magnetic resonance signal, and stores the obtained signal in the storage unit as the point spread function, and the image processing unit generates an image with a higher resolution by performing deconvolution calculation of the image of the subject and the point spread function.

2. The magnetic resonance imaging apparatus according to claim 1, wherein the phantom is 1 cc or more and less than 30 cc.

3. The magnetic resonance imaging apparatus according to claim 1, wherein the acquisition unit selectively excites only the atomic nuclear spins in a partial range of the phantom or the subject by the high-frequency magnetic field.

4. An image processing method for performing processing of increasing a resolution on an image captured by a magnetic resonance imaging device by using a point spread function obtained in advance, wherein the point spread function is a signal obtained by, after a phantom or a subject disposed in an imaging space of the magnetic resonance imaging device is irradiated with a high-frequency magnetic field, acquiring a nuclear magnetic resonance signal from the phantom without applying frequency encoding and phase encoding, and performing Fourier transform on the acquired nuclear magnetic resonance signal, and the image processing method further comprises generating an image with a higher resolution by performing deconvolution calculation of the image of the subject and the point spread function.

5. The image processing method according to claim 4, wherein the phantom is 1 cc or more and less than 30 cc.

6. The image processing method according to claim 4, further comprising selectively exciting only atomic nuclear spins in a partial range of the phantom or the subject by the high-frequency magnetic field.

7. An image processing apparatus for performing processing of increasing a resolution on a reconstructed image captured by a magnetic resonance imaging device by using a point spread function, the image processing apparatus comprising:

an image processing unit configured to perform processing of increasing a resolution on the reconstructed image by using the point spread function, the image processing unit including:

an acquisition unit configured to acquire the point spread function; and a storage unit configured to store the acquired point spread function, wherein the point spread function is a signal obtained by, after a phantom or a subject disposed in an imaging space of the magnetic resonance imaging device is irradiated with a high-frequency magnetic field, acquiring a nuclear magnetic resonance signal from the phantom without applying frequency encoding and phase encoding, and performing Fourier transform on the acquired nuclear magnetic resonance signal, and the image processing unit generates an image with a higher resolution by performing deconvolution calculation of the image of the subject and the point spread function.

8. The image processing apparatus according to claim 7, wherein the phantom is 1 cc or more and less than 30 cc.

9. The image processing apparatus according to claim 7, wherein the acquisition unit selectively excites only atomic nuclear spins in a partial range of the phantom or the subject by the high-frequency magnetic field.

* * * * *